(12) United States Patent
Buell

(10) Patent No.: US 11,557,430 B2
(45) Date of Patent: Jan. 17, 2023

(54) CURRENT TRANSFORMER POWERED CONTROLLER

(71) Applicant: Eaton Intelligent Power Limited, Dublin (IE)

(72) Inventor: Richard Ralph Buell, South Milwaukee, WI (US)

(73) Assignee: Eaton Intelligent Power Limited, Dublin (IE)

( * ) Notice: Subject to any disclaimer, the term of this patent is extended or adjusted under 35 U.S.C. 154(b) by 139 days.

(21) Appl. No.: 17/126,451

(22) Filed: Dec. 18, 2020

(65) Prior Publication Data

US 2021/0257158 A1     Aug. 19, 2021

Related U.S. Application Data

(60) Provisional application No. 62/978,383, filed on Feb. 19, 2020.

(51) Int. Cl.
*H02H 3/00* (2006.01)
*H01F 27/42* (2006.01)
(Continued)

(52) U.S. Cl.
CPC ............ *H01F 27/42* (2013.01); *H01F 27/28* (2013.01); *H01F 29/02* (2013.01); *H01H 47/00* (2013.01)

(58) Field of Classification Search
None
See application file for complete search history.

(56) References Cited

U.S. PATENT DOCUMENTS

| 4,761,606 A | 8/1988 | Germer et al. |
| 4,816,738 A * | 3/1989 | Nicolas ............... H05B 47/155 323/361 |

(Continued)

FOREIGN PATENT DOCUMENTS

| EP | 0420545 A2 | 4/1991 |
| EP | 0607711 A1 | 7/1994 |

(Continued)

OTHER PUBLICATIONS

Antoniy Trifonov, European International Searching Authority, International Search Report and Written Opinion, counterpart PCT Application No. PCT/EP2021/025046, dated May 19, 2021, 16 pages total.

(Continued)

*Primary Examiner* — Stephen W Jackson
(74) *Attorney, Agent, or Firm* — DiBerardino McGovern IP Group LLC

(57) ABSTRACT

A system includes a current transformer including: a primary coil, and a secondary coil including at least two taps; a tap selection circuit; a current measurement apparatus configured to produce an indication of an amount of current flowing in the secondary coil; a power supply electrically connected to a first one of the taps, the power supply configured to receive electrical power from the first one of the taps; and a controller coupled to the power supply and the current measurement apparatus, the controller configured to receive electrical power from the power supply and to control the tap selection circuit based on the indication of an amount of current in the secondary coil.

23 Claims, 4 Drawing Sheets

(51) Int. Cl.
  *H01F 27/28* (2006.01)
  *H01F 29/02* (2006.01)
  *H01H 47/00* (2006.01)

(56) References Cited

U.S. PATENT DOCUMENTS

| | | | |
|---|---|---|---|
| 5,059,896 | A | 10/1991 | Germer et al. |
| 5,258,704 | A | 11/1993 | Germer et al. |
| 5,289,110 | A * | 2/1994 | Slevinsky ............... G05F 1/20 |
| | | | 323/343 |
| 7,508,190 | B2 | 3/2009 | Kagan et al. |
| 7,683,605 | B2 | 3/2010 | Kagan et al. |
| 8,519,879 | B1 | 8/2013 | Denham |
| 8,750,060 | B2 | 6/2014 | Denham |
| 8,981,951 | B2 | 3/2015 | Subramanian et al. |
| 9,046,553 | B2 | 6/2015 | Richards |
| 9,154,713 | B2 | 10/2015 | Denham et al. |
| 9,568,504 | B2 | 2/2017 | Cabot et al. |
| 10,126,331 | B2 | 11/2018 | Cabot et al. |
| 2006/0170409 | A1 | 8/2006 | Kagan et al. |
| 2009/0212764 | A1 | 8/2009 | Kagan et al. |
| 2010/0179777 | A1 | 7/2010 | Kagan et al. |
| 2014/0160820 | A1 * | 6/2014 | McKinley ............... H01F 38/32 |
| | | | 363/126 |
| 2014/0268701 | A1 | 9/2014 | Haensgen et al. |

FOREIGN PATENT DOCUMENTS

| | | |
|---|---|---|
| EP | 0607711 B1 | 3/1999 |
| EP | 3591821 A1 | 1/2020 |
| JP | 2004235587 A | 8/2004 |
| WO | 2010040409 A1 | 4/2010 |

OTHER PUBLICATIONS

PSW102 type CT powered protection unit, Hyliton Electric, Apr. 30, 2019, avilable at http://www.hylitonelectric.com/static/upload/file/20190430/1556590385961985.pdf, 8 pages.

CSPR1-V24 Self Powered Relay, C S Electric Limited (Protection Control Division) 2015/2016 Catalog, 2016, available at https://cselectric.co.in/wp-content/uploads/2016/05/CSPR1-Catalogue.pdf, 12 pages.

WIC1—CT Powered Time Overcurrent and Earth Current Relay, Original Technical Manual WIC1 (Revision J), 2018, 58 pages.

Protective Relays Digitrip 3000, Cutler-Hammer, May 1999, 8 pages.

* cited by examiner

CURRENT TRANSFORMER POWERED CONTROLLER

CROSS-REFERENCE TO RELATED APPLICATION

This application claims the benefit of U.S. Provisional Application No. 62/978,383, filed on Feb. 19, 2020 and titled CURRENT TRANSFORMER POWERED CONTROLLER, which is incorporated herein by reference in its entirety.

TECHNICAL FIELD

This disclosure relates to a controller that is powered by a current transformer (CT). The controller is configured to adjust the turns ratio selection of the multi-tap CT based on an amount of current flowing in the secondary coil of the CT and the power status and settings of the controller.

BACKGROUND

A current transformer (CT) is a type of transformer that is used to reduce or increase an alternating current (AC) signal. A CT includes a primary winding and a secondary winding. The primary winding is electrically connected to a power distribution system. In operational use, the primary winding and the secondary winding are magnetically coupled, and current that flows in the primary winding induces a proportional current in the secondary winding.

SUMMARY

In one aspect, a system includes a current transformer including: a primary coil, and a secondary coil including at least two taps; a tap selection circuit; a current measurement apparatus configured to produce an indication of an amount of current flowing in the secondary coil; a power supply electrically connected to a first one of the taps, the power supply configured to receive electrical power from the first one of the taps; and a controller coupled to the power supply and the current measurement apparatus, the controller configured to receive electrical power from the power supply and to control the tap selection circuit based on the indication of an amount of current in the secondary coil.

Implementations may include one or more of the following features. The controller may be configured to determine whether to electrically connect an additional one of the taps to the power supply and the current measurement apparatus based on the indication of the amount of current in the secondary coil. The controller also may be configured to: compare the indication of the amount of current in the secondary coil to an overcurrent specification; and determine whether to generate a trip signal for a circuit breaker based on the comparison.

The tap selection circuit may include one or more switches, each switch associated with at least one of the taps, and the controller may be configured to electrically connect an additional one of the taps to the power supply by controlling a state of a switch associated with the additional one of the taps.

The current measurement apparatus may include an impedance network electrically connected to the secondary coil, and the indication of the amount of current in the secondary coil may be an indication of a voltage across the impedance network.

In some implementations, the system also includes a programmable gain amplifier that includes an input, an output, and an adjustable gain, where the input of the programmable gain amplifier is electrically connected to the current measurement apparatus and receives the indication of the amount of current in the secondary coil; the output of the programmable gain amplifier is electrically connected to the controller; and the controller is further configured to control the adjustable gain of the programmable gain amplifier.

In some implementations, the system also includes a shunting switch electrically connected to a particular one of the taps, the shunting switch having at least a first state and a second state, and where, in the first state, the shunt switch draws current from the particular one of the taps such that current from the particular one of the taps is not provided to the power supply. In some implementations, the system also includes a logic switch electrically connected to the controller and to the power supply, and the logic switch is configured such that the state of the shunting switch is determined by the status of the power supply and by a logic control signal provided by the controller. The taps include at least the first tap and a last tap, the first tap is associated with a minimum turns ratio, the last tap is associated with a maximum turns ratio; and the shunting switch may be electrically connected to the last tap such that, when the shunting switch is in the first state, the shunting switch shunts substantially all of the current from the secondary winding.

The controller may include an electronic processor and an electronic storage coupled to the electronic processor, the electronic storage including instructions that, when executed, cause the electronic processor to analyze the indication of the amount of current in the secondary coil to determine whether to connect an additional one of the taps to electrically connect to the power supply. The electronic storage may include instructions, that, when executed, cause the electronic processor to: compare the indication of the amount of current in the secondary coil to an overcurrent specification stored on the electronic storage; determine whether a fault condition exists based on the comparison; and if a fault condition exists, generate a trip signal and provide the trip signal to a circuit breaker. The controller may be a microcontroller.

The system also may include a plurality of rectifier circuits, each rectifier circuit being electrically connected to one of the taps and to the current measurement apparatus. In some implementations, the power supply includes a capacitor and a comparator; the capacitor is electrically connected to: an input of the comparator, the rectifier associated with the first one of the taps, and, if an additional one of the taps is electrically connected to the power supply through the tap selection circuit, to the additional one of the taps; the comparator is configured to compare a voltage across the capacitor to a reference voltage; the controller is electrically connected to an output of the comparator; and the status of the power supply is an output value of the comparator. The comparator may have two possible output values: a first output value and a second output value, and the comparator has the first output value except when the voltage across the capacitor is greater than the reference voltage.

In another aspect, an electronic relay configured to be powered by a single current transformer (CT) includes: a power supply configured to be electrically connected to a first tap on a multi-tap secondary coil of a single current transformer (CT) and to remain electrically connected to the first tap during operational use of the electronic relay such that the power supply receives electrical power from the current transformer; a current measuring apparatus electrically connected to a current measuring node and configured to produce an indication of an amount of current flowing in the secondary coil; a tap selection circuit configured to electrically connect one other of the taps on the secondary coil to the power supply; and a controller electrically connected to the power supply and the current measuring apparatus, the controller being configured to: determine whether to change the turns ratio of the CT based on the indication the amount of current in the secondary coil.

Implementations of any of the techniques described herein may include a controller, a current transformer, software stored on a non-transitory computer readable medium that, when executed, controls current transformer connections, a kit for retrofitting a current transformer, and/or a method. The details of one or more implementations are set forth in the accompanying drawings and the description below. Other features will be apparent from the description and drawings, and from the claims.

DRAWING DESCRIPTION

DETAILED DESCRIPTION

Figure 1:
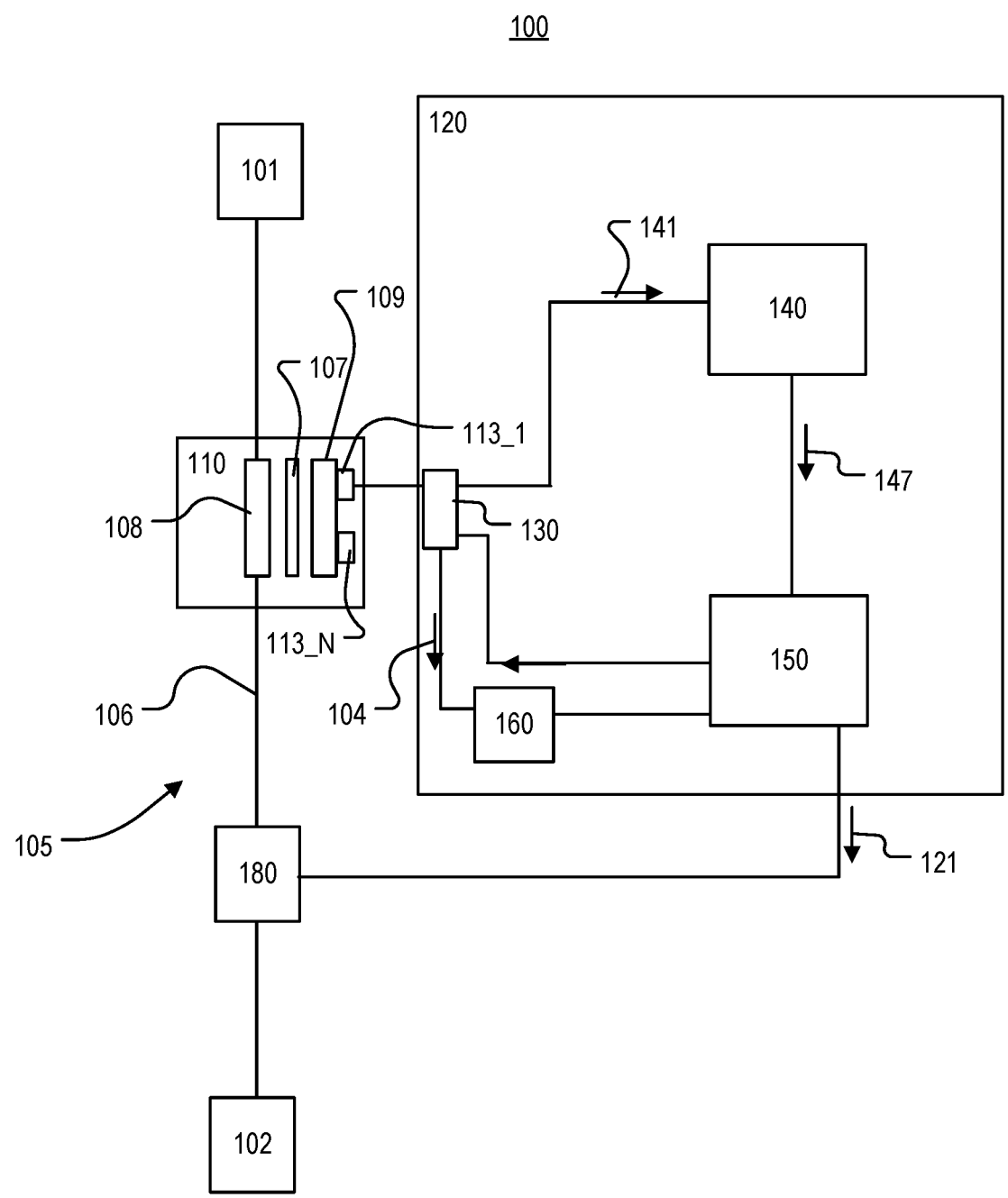
FIGS. 1-3 are block diagrams of various examples of systems that includes a multi-tap current transformer (CT) and a relay.

Referring to FIG. 1, a schematic of a system 100 is shown. The system 100 includes a multi-tap current transformer (CT) 110 and a protective relay 120. The relay 120 has a large operating current range (for example, from ones or tens amperes (A) to 25 kA) and is powered solely by the CT 110. The CT 110 provides electrical power 141 and a line current measuring signal (or metering current) 104 to the relay 120. The line current measuring signal 104 is the current that flows in a secondary coil 109 of the CT 110 and is an indication of the current that flows in a distribution path 106 from an AC power source 101 to a load 102. The protective relay 120 monitors the electrical conditions (for example, amplitude of voltage and/or current) on a distribution path 106.

The protective relay 120 generates a trip signal 121 to activate a circuit breaking mechanism 180 when a fault condition is detected on the distribution path 106. A fault condition exists when, for example, currents and/or voltages that exceed the safe operating parameters of one or more of the loads 102, the circuit breaking mechanism 180, or any other equipment that exists on the distribution path 106 or in the source 101. The circuit breaking mechanism 180 is any type of device that is capable of interrupting the electrical current provided to the loads 102. For example, the circuit breaking mechanism 180 may be a recloser or other switching device that opens the distribution path 106 in response to receiving the trip signal 121 but is also capable of repeatedly opening and closing the distribution path 106 to attempt to reestablish the electrical connection between the source 101 and the load 102.

The relay 120 includes a tap selection circuit 130, a power supply 140, and a controller 150. The CT 110 includes a primary coil 108 and the secondary coil 109. The CT 110 is a multi-tap CT, meaning that the secondary coil 109 has a plurality of taps or electrical contact points 113_1 to 113_N, where N is an integer that is greater than or equal to two (2).

The power supply 140 is always electrically connected to the tap 113_1. The power supply 140 receives electrical power 141 from the CT 110 via the tap 113_1. The power supply 140 is also coupled to the controller 150. The power supply 140 supplies electrical power 147 to the controller 150. The controller 150 selects other taps as appropriate depending on the conditions on the distribution path 106. When a tap is selected, that tap is also electrically connected to the power supply 140.

The primary coil 108 and the secondary coil 109 are magnetically coupled by a core 107. A time-varying (or alternating (AC)) electrical current in the primary coil 108 generates a time-varying magnetic field in the core 107, and the generated time-varying magnetic field induces a corresponding time-varying current in the secondary coil 109, and vice versa. The primary coil 108 is electrically connected the electrical distribution path 106, which is part of a high-power AC electrical distribution network 105. The AC electrical distribution network 105 distributes AC electrical power from the AC power source 101 to the loads 102. AC electrical power flows into the primary coil 108 and induces a corresponding AC current in the secondary coil 109.

The magnitude of the line current measuring signal 104 (which is the current that flows out of the secondary coil 109) depends on the amount of current that flows in the distribution path 106 and also depends on the ratio of the number of turns in the primary coil 108 to the number of turns in the secondary coil 109. The turns ratio is at its lowest when the tap 113_1 is selected and is at its highest when the tap 113_N is selected. For example, in some implementations, the CT 110 includes three taps 113_1, 113_2, and 113_3. The primary coil 108 is a single turn, and the secondary coil 109 has, for example, a total of 2000 turns, with, for example, the tap 113_1 encompassing 500 turns, the tap 113_2 encompassing 1000 turns, and the tap 113_3 encompassing 2000 turns. Continuing this example, the turns ratio is 1:500 when the tap 113_1 is selected, the turns ratio is 1:1000 when the tap 113_2 is selected, and the turns ratio is 1:2000 when the tap 113_N is selected. In other words, when the tap 113_3 is selected, the magnitude of the current that flows in the secondary coil 109 is 1/2000 of the magnitude of the current that flows in the primary coil 108. When the tap 113_1 is selected the magnitude of the current that flows in the secondary coil 109 is 1/500 of the magnitude of the current that flows in the primary coil 108.

In the system 100, the controller 150 controls the turns ratio of the CT 110 by selecting one or more of the taps 113_2 to 113_N (or by keeping the tap 113_1 as the only selected tap). The selection of taps is based on the metering current 104. In this way, the controller 150 dynamically changes or adjusts the turns ratio for the conditions on the distribution path 106. The configuration of the relay 120 allows both the electrical power 141 and the line current measuring signal 104 to be provided by the single CT 110, even for applications that demand a wide range of operating currents.

A single, particular turns ratio is generally not ideal or even acceptable for all operating currents. For example, during a low-current condition, the turns ratio of the CT 110 should be relatively small to ensure that the electrical signal 141 is sufficient to power up the relay 120 and to ensure that the line current measuring signal 104 is large enough to be accurately measured. During a high-current condition, the turns ratio should be relatively high so that the line current measuring signal 104 does not saturate and/or damage components in the relay 120. Moreover, in situations in which the current in the primary coil 108 is very low, the magnetizing current of the core 107 subtracts from or reduces the current that flows in the secondary coil 109. This reduction in current in the secondary coil 109 may prevent the relay 120 from powering up and also may cause errors in the line current measuring signal 104. A low turns ratio generally increases the electrical current 141 available for powering up the relay, but a high turns ratio reduces errors in the measuring signal 104. Furthermore, when very high currents flow in the primary coil 108, the core 107 saturates, leading to errors in the line current measuring signal 104. Thus, there is not a turns ratio that is optimal for all conditions. Accordingly, for an application with a large range of possible operating currents, a fixed turns ratio does not achieve ideal or even (in some cases) acceptable performance.

To address these challenges, some prior systems use more than one CT (for example, 6 CTs or 8 CTs) with a protective relay. In these prior systems, each CT is associated with a particular portion of the specified operating current range. Such an approach may be costly, cumbersome, and challenging to maintain. On the other hand, the system 100 addresses these challenges with the relay 120, which dynamically selects the tap ratio based on the metering current 104. The configuration of the relay 120 allows one CT (the CT 110) to be used even in applications with a wide range of operating currents.

As shown in FIG. 1, the CT is used in the electrical power distribution network 105. The electrical power distribution network 105 may be, for example, an electrical grid, an electrical system, or a multi-phase electrical network that provides electricity to commercial and/or residential customers. The power distribution network 105 may have an operating voltage of, for example, at least 1 kilovolt (kV), up to 34.5 kV, up to 38 kV, up to 69 kV, or 69 kV or higher. The power distribution network 105 is an alternating current (AC) electrical network and may operate at a fundamental frequency of, for example, 50-60 Hertz (Hz). The distribution path 106 may be, for example, a transmission line, an electrical cable, and/or any other mechanism for transmitting electricity.

The electrical loads 102 may be any device that utilizes electricity and may include electrical equipment that receives and transfers or distributes electricity to other equipment in the electrical power distribution network 105. The electrical loads 102 may include, for example, transformers, switchgear, energy storage systems, computer and communication equipment, lighting, heating and air conditioning, motors and electrical machinery in a manufacturing facility, and/or electrical appliances and systems in a residential building.

The power source 101 may be any source of electricity such as, for example, a power plant that generates electricity from fossil fuel or from thermal energy or an electrical substation. The power sources 101 may include one or more distributed energy resources, such as, for example, a solar energy system that includes an array of photovoltaic (PV) devices that convert sunlight into electricity or a wind-based energy system. More than one power source may supply electricity to the electrical power distribution network 105, and more than one type of power source may supply electricity to the electrical power distribution network 105.

Figure 2:
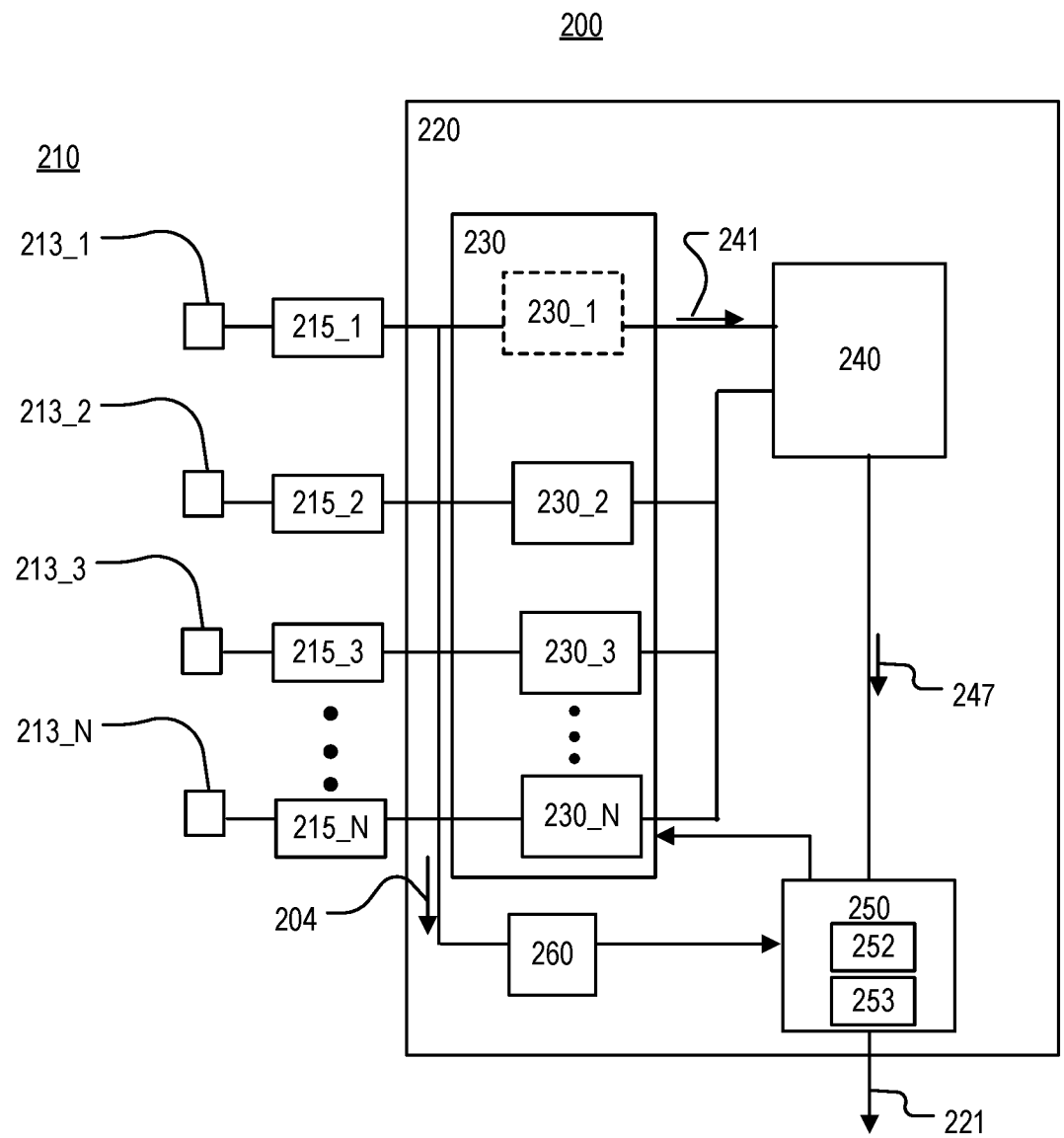

Referring to FIG. 2, a schematic of a system 200 is shown. The system 200 includes a multi-tap current transformer (CT) 210 and a relay 220. The relay 220 is an implementation of the relay 120 (FIG. 1) and may be used in the electrical power distribution network 105.

The relay 220 includes a tap selection circuit 230, a power supply 240, a current measurement apparatus 260, and a controller 250. The CT 210 includes taps 213_1 to 213_N, where N is an integer number greater than or equal to two (2). Each tap 213_1 to 213_N is electrically connected to a respective rectifier 215_1 to 215_N, which converts AC electrical power to DC electrical power. The CT 210 also includes primary and secondary coils and a core (not shown) that perform in a manner similar to the coils 108 and 109 and core 107 discussed with respect to FIG. 1. The current that flows out of the secondary coil through the selected taps is a metering current 204. The controller 250 selects a certain one or ones of the taps 213_1 to 213_N to control the turns ratio of the CT 210. The power supply 240 includes electronic elements (such as capacitors) that store electrical charge and are charged by electrical power 241 that flows from the secondary coil through the selected taps.

The tap selection circuit 230 includes switching apparatuses 230_2 to 230_N. Each switching apparatus 230_2 to 230_N has at least an ON state that conducts current and an OFF state that does not conduct current. Each switching apparatus 230_2 to 230_N includes one or more controllable electronic switches such as, for example, transistors. When the switching apparatus 230_2 is in the ON state, the tap 213_2 is selected. The turns ratio of the CT 210 is the turns ratio associated with the tap 213_2, and the tap 213_2 is electrically connected to the power supply 240. When the switching apparatus 230_2 is in the OFF state, the tap 213_2 is not selected and the tap 213_2 is not electrically connected to the power supply 240. Each of the other N switching apparatuses is configured in the same manner. Thus, when the switching apparatus 230_3 is in the ON state, the tap 213_3 is selected and so on. The state of each of the switching apparatuses 230_2 to 230_N is controlled by the controller 250. Thus, the controller 250 determines the turns ratio of the CT 210.

The tap selection circuit 230 is provided as an example, and other configurations are possible. For example, in some implementations, the tap selection circuit 230 includes a switching apparatus 230_1 connected to the output of the rectifier 215_1. In these implementations, the switching apparatus 230_1 is a normally on switch such that the power supply 240 generally remains electrically connected to the tap 213_1. For example, the switching apparatus 230_1 may be a depletion-mode MOSFET that is ON at a zero (0) gate to source voltage.

The controller 250 includes an electronic processing module 252 that is coupled to an electronic memory 253. The electronic processing module 252 includes one or more electronic processors. The electronic processors of the module 252 may be any type of electronic processor and may include, for example, a general purpose central processing unit (CPU), a graphics processing unit (GPU), a field-programmable gate array (FPGA), Complex Programmable Logic Device (CPLD), and/or an application-specific integrated circuit (ASIC).

Figure 3:
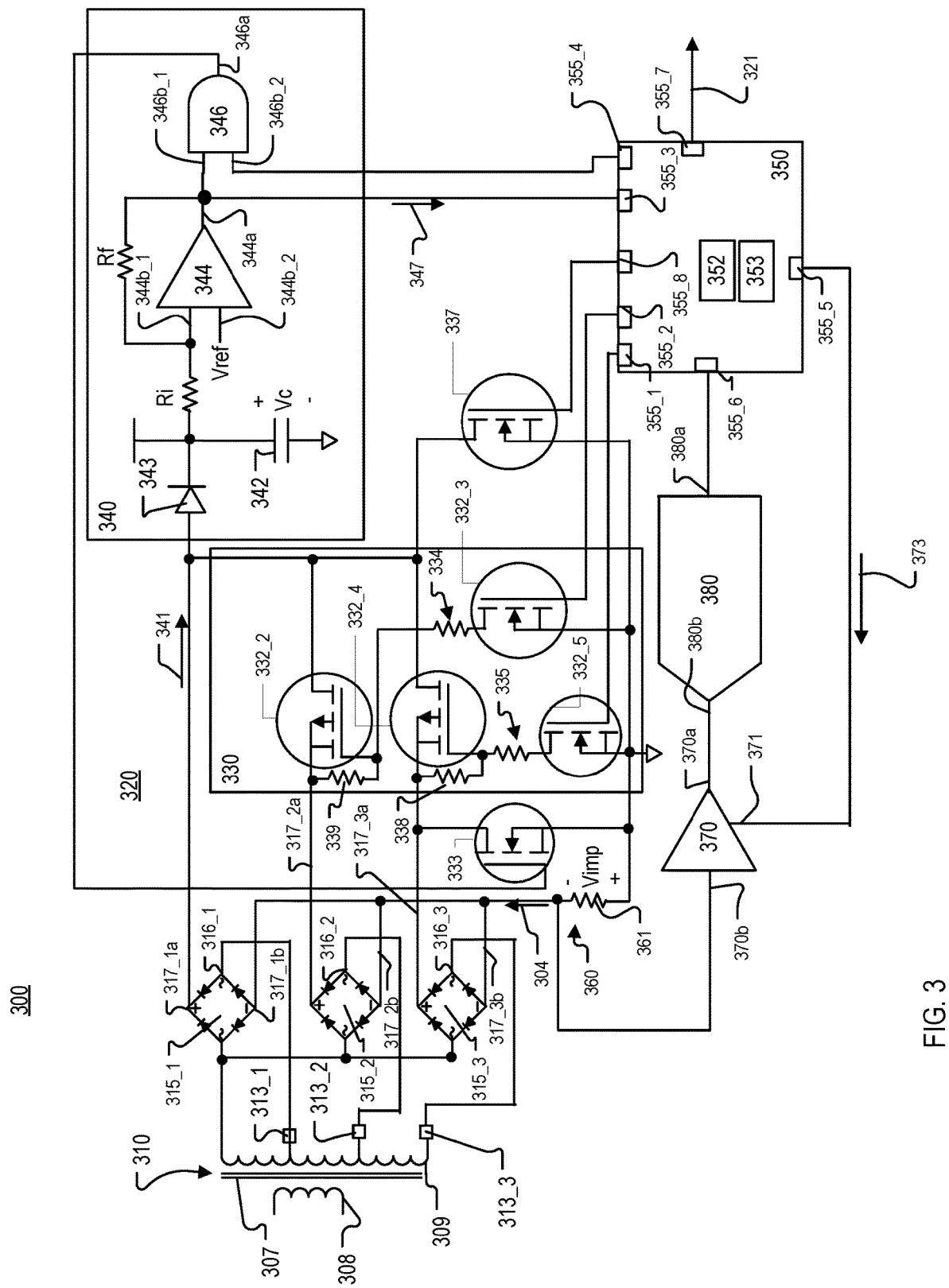

The electronic memory 253 may be any type of electronic memory that is capable of storing data and instructions in the form of computer programs or software, and the electronic memory 253 may include volatile and/or non-volatile components. The electronic memory 253 and the processing module 252 are coupled such that the processing module 252 is able to access or read data from and write data to the electronic memory 253. The controller 250 may be a microcontroller (as shown in FIG. 3).

The electronic memory 253 stores information related to the operation of the relay 220. For example, the electronic memory 253 may store information that relates a value of the metering current 204 or a range of values of the metering current 204 to a turns ratio of the CT 210. To provide specific examples, the lookup table relates a relatively low value of the metering current 204 to a lower turns ratio (selection of the tap 213_1 and the taps 213_2 to 213_N are not selected). The lookup table relates relatively high value of the metering current 204 to a high turns ratio (selection of the tap 213_N). Alternatively or additionally, the electronic memory 253 may store instructions, for example, in the form of a computer program, subroutine, rule, or function, that, when executed by the processing module 252, process information about the metering current 204 and determines which taps 213_1 to 213_N to select.

Moreover, the electronic memory 253 stores information about the system 200 and the relay 220. For example, the electronic memory 253 may store the value of N (the total number of taps in CT 210), or the value of an impedance used in the current measuring apparatus 260. For example, in some implementations, the current measuring apparatus 260 includes an impedance (such as an impedance 361 of FIG. 3) and a voltage measurement apparatus (for example, a voltmeter). In these implementations, the electronic memory 253 stores instructions that, when executed by the processing module 252, determines the metering current 204 based on the measured voltage across the impedance and the known value of the impedance.

The electronic memory 253 also stores information regarding the generation of a trip signal 221. The trip signal 221 is a signal that is sufficient to cause a circuit breaker (such as the circuit breaking mechanism 180 of FIG. 1) to operate. For example, the electronic memory 253 may store instructions or rules that specify when that the trip signal 221 is generated when the metering current 204 exceeds a threshold value for longer than a threshold time duration or for more than a threshold number of times within a threshold time duration. The threshold value may be, for example, an overcurrent setting.

The information on the electronic memory 253 may be stored on the electronic memory 253 when the relay 220 is manufactured, and/or the electronic memory 253 may be updatable during the life of the relay 220. In implementations in which the memory 253 is updatable, the relay 220 may be used to retrofit many different combinations of a single CT and a corresponding circuit breaker by updating the information stored on the electronic memory 253.

The relay 220 may include additional components. For example, the relay 220 may include shunting circuitry and electronic components such as an analog-to-digital converter (ADC). An example of a relay with additional components is discussed with respect to FIG. 3.

Referring to FIG. 3, a schematic of a system 300 is shown. The system 300 includes a multi-tap current transformer (CT) 310 and a relay 320. The relay 320 is an implementation of the relay 120 (FIG. 1), and the relay 320 may be used in the distribution network 105. The CT 310 includes a primary coil 308, a core 307, and a secondary coil 309. The primary coil 308 is electrically connected to a high-power AC electrical distribution network, such as the network 105 of FIG. 1.

The relay 320 includes a tap selection circuit 330, a current measurement apparatus 360, a power supply 340, and a controller 350. The secondary coil 309 of the CT 310 includes three taps: 313_1, 313_2, 313_3. The controller 350 determines the appropriate turns ratio for the conditions by controlling whether or not the tap 313_2 and/or the tap 313_3 are also selected. The controller 350 controls the tap selection circuit 330 (and thus the turns ratio of the CT 310) based on the metering current 304 (which is an indication of an amount of current in the secondary coil of the CT 310).

Each tap 313_1, 313_2, 313_3 of the CT 310 is electrically connected to a respective rectifier 315_1, 315_2, 315_3. The rectifiers 315_1, 315_2, 315_3 produce a direct current (DC) output from an alternating current (AC) input. Each tap 313_1, 313_2, 313_3 is electrically connected to a respective rectifier input 316_1, 316_2, 316_3. The rectifiers 315_1, 315_2, 315_3 are full-wave bridge rectifiers that have respective positive outputs 317_1a, 317_2a, 317_3a and respective negative outputs 317_1b, 317_2b, 317_3b.

Each rectifier 315_1, 315_2, 315_3 includes a plurality of diodes arranged in in a bridge circuit configuration. The bridge circuit configuration ensures that the polarity at the positive outputs 317_1a, 317_2a, 317_3a is positive and the polarity of the negative outputs 317_1b, 317_2b, 317_3b is negative regardless of the polarity at the respective inputs 316_1, 316_2, 316_3. In the example of FIG. 3, each rectifier 315_1, 315_2, 315_3 includes four diodes. Other rectifier configurations that are known in the art may be used.

The tap 313_1 is always selected. Current flowing in the secondary coil 309 is provided to a capacitor network 342 in the power supply 340 and to the impedance 361 of the current measurement apparatus 360 through the tap 313_1 (and any other of the N taps that are selected). The metering current 304 (which is the current that flows in the secondary coil 309) flows through the impedance 361. The controller 350 uses the voltage across the impedance 361 (Vimp) to determine the metering current 304. The controller 350 determines the appropriate turns ratio (tap selection) based on the value of Vimp (which is proportional to or indicative of the metering current 304). The controller 350 also determines whether to generate a trip signal based on value of Vimp.

In the example of FIG. 3, the controller 350 is a microcontroller that includes an electronic processing module 352, an electronic memory 353, and a plurality of general purpose input/output (GPIO) pins 355_1, 355_2, 355_3, 355_4, 355_5, 355_6, 355_7. The electronic processing module 352 includes one or more electronic processors, such as, for example, central processing units (CPUs). The electronic memory 353 may be, for example, random access memory (RAM) and/or read-only memory (ROM). The electronic memory 353 stores information and/or data used for the operation of the controller 350. For example, the electronic memory 353 may store information about the system 300 such as the value of the impedance 361 and the number of taps in the CT 310. The electronic memory 353 also may store information in the form of a lookup table that relates the tap selection to data received at the microcontroller 350 input pins. For example, the electronic memory 353 may specify which taps to select for various values of Vimp or/and various values of the metering current 304. To provide specific examples, the lookup table relates a relatively low value of the metering current 304 is associated to a lower turns ratio (selection of the tap 313_1 and the taps 313_2 and 313_3 are not selected). The lookup table relates relatively high value of the metering current 304 to a high turns ratio (selection of the tap 313_3). Alternatively or additionally, the electronic memory 353 may store equations or rules implemented in the form of instructions or computer programs that are executable by the processing module 352. The instructions or computer programs determine values such as the metering current 304 and/or determine which taps to select based on the current conditions.

The GPIO pins are software configurable to be either inputs or outputs. GPIO pins configured in the input state receive external signals. GPIO pins configured in the output state provide electrical signals to external devices. In the example of FIG. 3, the GPIO pins 355_1, 355_2, 355_4, 355_5, and 355_7 are configured in the output state and are referred to as output pins. The GPIO pins 355_3 and 355_6 are configured in the input state and are referred to as input pins.

The positive rectifier output 317_1a is always electrically connected to the power supply 340. The power supply 340 includes a diode 343, the capacitor network 342, a comparator 344, and a logic element 346. In the example of FIG. 3, the anode of the diode 343 is connected to the positive output 317_1a, and the cathode is connected to the capacitor network 342. The anode of the diode 342 is the input node or input of the power supply 340. The capacitor network 342 includes one or more capacitors. The comparator 344 has one digital output 344a and two analog inputs 344b_1 and 344b_2. The input 344b_1 is connected to the capacitor network 342. The voltage at the input 344b_1 is Vc, which is the voltage across the capacitor network 342 of the power supply 340. The input 344b_2 is connected to a reference voltage (Vref). The comparator 344 compares the voltage at the input 344b_1 and the voltage at the input 344b_2. The voltage at the output 344a indicates which of the input voltages is larger. For example, the comparator 344 may be configured to produce a voltage of 1 if the voltage at the input 344b_1 is greater than the voltage at the input 344b_2 and a voltage of 0 if the voltage at the input 344b_1 is less than the voltage at the input 344b_2. Thus, the comparator 344 indicates whether Vc is greater than the reference voltage (Vref) and the output of the comparator 344 may be used to determine whether the capacitor network 342 is sufficiently charged. The output of the comparator 344 provides an indication of the status of the power supply 340.

The logic element 346 is an AND logic element that includes one digital output 346a and two digital inputs 346b_1 and 346b_2. The logic element 346 has a first output state (HIGH) and a second output state (LOW). The digital input 346b_1 is connected to the output 344a of the comparator 344. The digital input 346b_2 is connected to the microcontroller 350 output pin 355_4. When the digital input 346b_1 or 346b_2 is 0 or when the digital input 346b_1 and 346b_2 are both 0, the output 346a is LOW (for example, 0). When both of the digital inputs 346b_1 and 346b_2 are 1, the output 346a is HIGH (for example, 1).

The relay 320 also includes a shunting switch 333 and a burden switch 337. The shunting switch 333 is used to regulate the power supply voltage. In the example of FIG. 3, the shunting switch 333 is an n-channel MOSFET. The source of the MOSFET 333 is connected to ground. The gate of the MOSFET 333 is connected to the output 346a of the logic element 346. The drain of the MOSFET 333 is connected to the positive rectifier output 317_3a. When the voltage across the capacitor 342 (Vc) exceeds the reference voltage Vref and microcontroller output 355_4 is high then the shunting switch 333 is ON and all the CT secondary current flows through the shunting switch 333 thus bypassing the power supply 340 input. This action sets the upper voltage limit of the power supply 340. The shunting switch 333 will stay on until the power supply load current discharges capacitor 342 to the lower power supply limit determined by the hysteresis set by an input resistor Ri and a feedback resistor Rf for the comparator 344.

The negative rectifier outputs 317_1b, 317_2b, 317_3b are electrically connected to the current measurement apparatus 360. In the example of FIG. 3, the current measurement apparatus 360 is the impedance 361 that is connected between the negative rectifier outputs 317_1b, 317_2b, 317_3b and ground. The voltage across the impedance 361 (Vimp) is input into a programmable gain amplifier (PGA) 370.

The burden switch 337 may be any type of switch that has at least an on and an off state. In the example of FIG. 3, the burden switch 337 is a MOSFET and is referred to as the transistor 337. The drain of the transistor 337 connects to the power input of power supply 340, which is the anode of the diode 343 in this example. The source of the transistor 337 is connected to circuit common (ground) and the gate is connected to the microcontroller 350 output pin 355_8. Before the microcontroller reads CT 310 current (for example, by obtaining a measurement of Vimp), the output 355_8 is set HIGH, turning on the transistor 337 which shorts out the input to the power supply 340 and eliminates the burden voltage seen by the CT 310. Reducing the burden voltage of the CT 310 reduces the excitation current and results in a higher output current that more closely represents the CT primary current divided by the turns ratio. After the CT 310 current is read the output 355_8 is set LOW, turning the transistor 337 off and once again allowing current to flow into the power supply 340. The diode 343 prevents discharge of the capacitor network 342 during the operation of the transistor 333 or the transistor 337. The output 355_4 of the controller 350 is set LOW any time a CT current measurement is being made to prevent the operation of the transistor 333 from interfering with the tap selection.

The PGA 370 includes an input 370b, an output 370a, and a gain control input 371. The PGA 370 is an electronic amplifier that amplifies the voltage at the input 370b to produce an amplified voltage at the output 370a. The amount of amplification provided by the PGA 370 is controlled by a gain control signal 373, which is received at the gain control input 371. The gain control input 371 is electrically connected to the controller 350 output pin 355_5. The gain control signal 373 is produced by the microcontroller 350 and is provided to the PGA 370 through the output pin 355_5. By controlling the gain of the PGA 370 through the gain control signal 373, the controller 350 ensures that the PGA 370 amplifies the Vimp voltage to a value that is within the operating range of the PGA 370. Thus, the value of Vimp is accurately reproduced and is not clipped or otherwise distorted.

The output 370a of the PGA 370 is electrically connected to an input 380b of an analog-to-digital converter (ADC) 380. The ADC 380 converts the analog output of the PGA 370 into a digital signal that is output at output 380a. The output 380a is electrically connected to the input pin 355_6 of the microcontroller 350. Thus, a digitized and amplified version of the voltage across the impedance 361 is provided to the microcontroller 350 input pin 355_6.

The tap selection circuit 330 includes a plurality of switches 332_2, 332_3, 332_4, 332_5. The switches 332_2, 332_3, 332_4, 332_5 are electronic elements that have at least an ON state and an OFF state. In the ON state, the switch conducts current. In the OFF state, the switch does not conduct current. In the example of FIG. 3, each switch 332_2, 332_3, 332_4, 332_5 is a metal oxide semiconductor field effect transistor (MOSFET). Each switch 332_2, 332_3, 332_4, 332_5 includes a gate, a drain, and a source. The voltage at the gate, with respect to the source, determines whether or not current flows between the source and the drain. Thus, the voltage at the gate with respect to the source determines the state of the MOSFET.

In the example of FIG. 3, the MOSFETs 332_3 and 332_5 are n-channel MOSFETs. The source of each of the MOSFETs 332_3 and 332_5 is connected to ground. In the example of FIG. 3, the MOSFETs 332_2 and 332_4 are p-channel MOSFETs. The source of the MOSFET 332_2 is electrically connected to the positive rectifier output 317_2a. The source of the MOSFET 332_4 is electrically connected to the positive rectifier output 317_3a. The gate of the MOSFET 332_3 is connected to the microcontroller 350 output pin 355_2. The gate of the MOSFET 332_5 is connected to the microcontroller 350 output pin 355_1. The drain of the MOSFET 332_3 is electrically connected to the gate of the MOSFET 332_2 through a resistor 334. The drain of the MOSFET 332_5 is electrically connected to the gate of the MOSFET 332_4 through a resistor 335. The gate of MOSFET 332_2 is connected to the source of MOSFET 332_2 through a resistor 339, which biases the MOSFET 332_2 OFF when MOSFET 332_3 is OFF. The gate of MOSFET 332_4 is connected to the source of MOSFET 332_4 through a resistor 338, which biases the MOSFET 332_4 OFF when MOSFET 332_5 is OFF.

When the MOSFETs 332_3 and 332_5 are both OFF, the taps 313_2 and 313_3 are not selected. In this configuration only the tap 313_1 (which is always electrically connected to the power supply 340) is selected. When the MOSFET 332_3 is ON, the tap 313_2 is selected. When the MOSFET 332_5 is ON, the tap 313_3 is selected.

Figure 4:
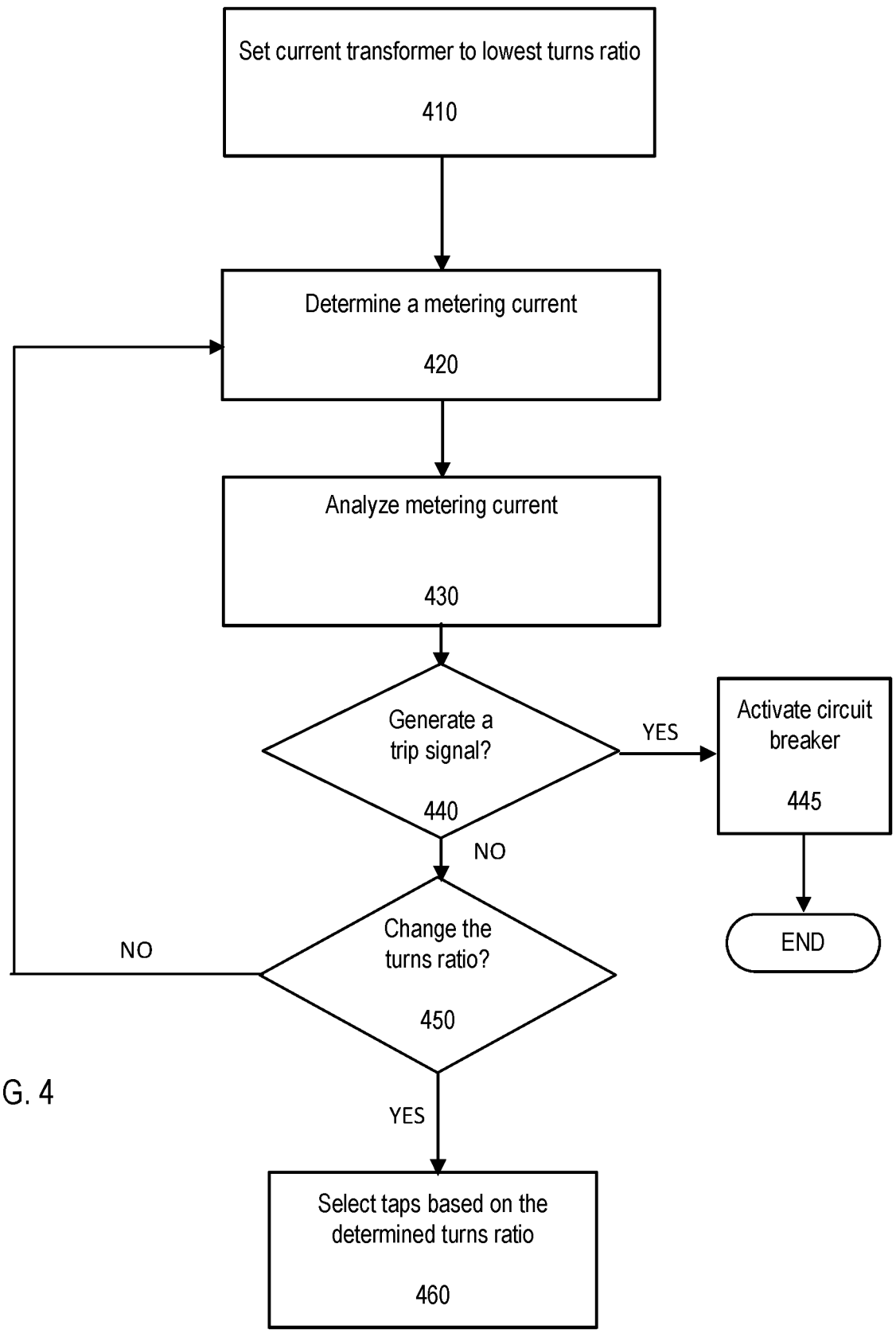
FIG. 4 is a flow chart of an example of a process for dynamically adjusting a turns ratio of a single CT.

FIG. 4 is a flow chart of a process 400. The process 400 is an example of a process for dynamically adjusting a turns ratio of a single CT. The process 400 may be performed by the controller 150, the controller 250, or the controller 350. The process 400 is discussed with respect to the controller 350 and, in the example below, the process 400 is performed by one or more electronic processors in the processing module 352.

The process 400 begins in a situation in which there is little to no current flowing in the distribution path 106 and thus, the metering current 304 is essentially zero (0). For example, such a situation may occur after a fault condition has been cleared and the distribution network is restoring power.

When the relay 320 is initially powered up, the capacitors 342 are not charged and it is desirable to have the lowest turns ratio possible in the CT 310 to maximize the amount of current provided to the capacitors in the capacitor network 342. The CT 310 is set to the lowest turns ratio (410). The lowest turns ratio for the CT 310 is achieved when only the tap 313_1 is selected. Thus, the controller 350 ensures that the MOSFETS 332_3 and 332_5 are in the OFF state. For example, the output pins 355_1 and 355_2 may provide a voltage that is below the turn-on threshold to the gate of each of the MOSFETs 332_3 and 332_5.

As power is restored to the network 105, AC current flows in the primary coil 108. The AC current in the primary coil 308 induces AC current in the secondary coil 309, and an electrical power 341 flows into the power supply 340. The electrical power 341 charges the capacitor 342. When Vc exceeds Vref, the output of the comparator 344 becomes HIGH, and a fully charged signal 347 is provided to the controller 350.

After the controller 350 is powered, the controller 350 determines the value of the metering current 304 (420). For example, the electronic memory 353 may store instructions to calculate the metering current 304 by dividing the amplified Vimp value received at the input pin 355_6 by the known value of the impedance 361 and the amplification factor of the PGA 370. The amplification factor of the PGA 370 is determined by the gain control signal 373, which is produced by the controller 350 and is thus known.

The metering current 304 is analyzed (430). For example, the metering current 304 may be compared to ranges of metering currents stored in a lookup table on the electronic memory 353. The controller 350 determines the appropriate turns ratio for the CT 310 using the value of the metering current 304 and a lookup table stored on the electronic memory 353 and/or the processing module 352 executing instructions or a computer program stored on the electronic memory 353. If the value of the metering current 304 is relatively low, the low turns ratio is maintained and the taps 113_2 and 113_3 remain unselected. If the value of the metering current is relatively high, the tap 113_2 or the tap 113_3 are selected. Additionally, the determined metering current 304 is compared to trip criteria stored on the electronic memory 353. The trip criteria are current values that indicate a fault condition. When the metering current 304 has a value that exceeds the current value associated with a fault condition, a trip signal 321 is generated to protect the load 102.

If the determined metering current 304 exceeds the trip criteria, then the trip signal 321 is generated (440). If the trip signal 321 is generated, the circuit breaking mechanism 180 is activated (445). The process 400 may end or may return to (410).

If the metered current 304 does not indicate that the trip signal 321 should be generated, the control 350 determines whether the turns ratio of the CT 310 should be changed. For example, a lookup table stored on the electronic memory 353 may include three current ranges, each of which is a subset of a total operating range of 5 A to 25 kA. Each subrange is associated with a turns ratio of the CT 310. If the metered current 304 is outside of the subrange associated with the lowest turns ratio, the control 350 determines that the turns ratio should be changed (450). The control 350 then determines which subrange encompasses the value of the determined metered current 304 and the turns ratio associated with that subrange. The control 350 then changes the turns ratio by selecting the appropriate taps (460).

For example, if the lookup table specifies that the tap 313_2 should be selected, the controller 350 selects the tap 313_2. To select the tap 313_2, the controller 350 generates a voltage signal on the output pin 355_2 that is sufficient to turn the MOSFET 332_3 ON. When the MOSFET 332_3 is ON, current flows through the resistor 334, and the gate to source voltage of the MOSFET 332_2 rises until the MOSFET 332_2 turns ON. The tap 313_2 is then electrically connected to the power supply 340 through the positive rectifier output 317_2a and current flows to the impedance 361 through the negative rectifier output 317_2b.

In another example, if the lookup table specifies that the tap 313_3 should be selected, the controller 350 selects the tap 313_3. To select the tap 313_3, the controller 350 generates a voltage signal on the output pin 355_1 that is sufficient to turn the MOSFET 332_5 ON. When the MOSFET 332_5 is ON, current flows through the resistor 335 and the gate to source voltage of the MOSFET 332_4 rises until the MOSFET 332_4 turns ON. The tap 313_3 is then electrically connected to the power supply 340 through the positive rectifier output 317_3a and current flows to the impedance 361 through the negative rectifier output 317_3b.

If the controller 350 changes the turns ratio, the amplitude of the metering current 304 also changes. Thus, if the controller 350 changes the turns ratio, the controller 350 also changes the gain of the PGA 370 to maintain the appropriate amplitude of the signal 370*a* after being amplified by the PGA 370.

In this way, the controller 350 determines which of the taps 313_2, 313_3 to select based on the amount of current flowing in the secondary coil 309. Thus, the CT 310 provides power and metering current (or measuring current) to the relay 320.

If the analysis of the determined metered current 304 does not indicate that the turns ratio of the CT 310 should be changed, the process 400 returns to (420) and continues to monitor the metered current 304.

As discussed above with respect to FIG. 3, the relay 320 also includes the MOSFET 333, which is used as shunt regulator circuitry, and the MOSFET 337, which is used to reduce CT burden during current metering. The MOSFET 333 and 337 may be used to prevent damage to the various components of the relay 320 and to obtain more accurate measurements of Vimp. In some implementations, the process 400 includes activation of the shunt circuitry before determining the metering current 304 in (420).

Although it is beneficial to maximize the amount of current provided to the capacitors in the network 342, if a fault condition is present on the distribution path 106, high currents will flow into the relay 320 and may damage various components of the relay 320. To mitigate the possibility of such damage, the relay 320 includes shunt regulator circuitry. In the example shown in FIG. 3, the shunt regulator circuitry is the MOSFET 333. When the MOSFET 333 is in the ON state, it conducts current from the positive rectifier output 317*a*_3 to ground, thus shorting the secondary coil 309 and preventing current from flowing from any other selected taps.

In addition to mitigating damage from high fault currents, the shunt circuitry also may be used to improve the quality of the measurement of the current in the secondary coil 309. For example, the controller 350 may cause the MOSFET 337 to turn ON just prior to obtaining a measurement of Vimp to prevent or reduce switching noise from interfering with the measurement. When the CT 310 is supplying current to the capacitor network 342, the burden voltage causes the flux level of the core 307 to increase. When the power supply 340 is fully charged (when Vc is equal to or greater than the reference voltage) and the shunt regulator (the MOSFET 337) turns ON, there is a sudden release of energy from the core 307 as the CT 310 is essentially working into a short circuit. Some of the energy may appear in the measurement of Vimp as switching noise.

Other features are within the scope of the claims. For example, the system 100 only shows a single phase, however, the relay 120, 220, or 320 may be used in a multi-phase configuration. In a multi-phase configuration, each phase includes an instance of the relay.

What is claimed is:

1. A system comprising:
   a current transformer comprising:
      a primary coil; and
      a secondary coil comprising taps;
   a tap selection circuit;
   a current measurement apparatus configured to produce an indication of an amount of current flowing in the secondary coil;
   a power supply electrically connected to a first one of the taps, the power supply configured to receive electrical power from the first one of the taps; and
   a controller coupled to the power supply and the current measurement apparatus, the controller configured to receive electrical power from the power supply and to control the tap selection circuit based on the indication of an amount of current in the secondary coil, wherein the tap selection circuit comprises a plurality of switches configured to control an electrical connection between the taps and the power supply.

2. The system of claim 1, wherein the controller is configured to determine whether to electrically connect an additional one of the taps to the power supply and the current measurement apparatus based on the indication of the amount of current in the secondary coil.

3. The system of claim 1, wherein the controller is further configured to:
   compare the indication of the amount of current in the secondary coil to an overcurrent specification; and
   determine whether to generate a trip signal for a circuit breaker based on the comparison.

4. The system of claim 1, wherein each switch is associated with at least one of the taps, and the controller is configured to electrically connect an additional one of the taps to the power supply by controlling a state of a switch associated with the additional one of the taps.

5. The system of claim 1, wherein the current measurement apparatus comprises an impedance network electrically connected to the secondary coil, and the indication of the amount of current in the secondary coil comprises an indication of a voltage across the impedance network.

6. The system of claim 1, further comprising a programmable gain amplifier comprising an input, an output, and an adjustable gain, wherein
   the input of the programmable gain amplifier is electrically connected to the current measurement apparatus and receives the indication of the amount of current in the secondary coil;
   the output of the programmable gain amplifier is electrically connected to the controller; and
   the controller is further configured to control the adjustable gain of the programmable gain amplifier.

7. The system of claim 1, further comprising a shunting switch electrically connected to a particular one of the taps, the shunting switch comprising at least a first state and a second state, and wherein, in the first state, the shunt switch draws current from the particular one of the taps such that current from the particular one of the taps is not provided to the power supply.

8. The system of claim 7, further comprising a logic switch electrically connected to the controller and to the power supply, and wherein the logic switch is configured such that the state of the shunting switch is determined by the status of the power supply and by a logic control signal provided by the controller.

9. The system of claim 7, wherein the current transformer has a variable turns ratio, the taps comprise at least the first tap and a last tap, the first tap is associated with a minimum turns ratio, and the last tap is associated with a maximum turns ratio; and
   the shunting switch is electrically connected to the last tap such that, when the shunting switch is in the first state, the shunting switch shunts substantially all of the current from the secondary winding.

10. The system of claim 2, wherein the controller comprises an electronic processor and an electronic storage coupled to the electronic processor, the electronic storage comprising instructions that, when executed, cause the electronic processor to analyze the indication of the amount of current in the secondary coil to determine whether to connect an additional one of the taps to electrically connect to the power supply.

11. The system of claim 10, wherein the electronic storage further comprises instructions, that, when executed, cause the electronic processor to:
compare the indication of the amount of current in the secondary coil to an overcurrent specification stored on the electronic storage;
determine whether a fault condition exists based on the comparison; and
if a fault condition exists, generate a trip signal and provide the trip signal to a circuit breaker.

12. The system of claim 11, wherein the controller comprises a microcontroller.

13. The system of claim 1, further comprising a plurality of rectifier circuits, each rectifier circuit electrically connected to one of the taps and to the current measurement apparatus.

14. The system of claim 13, wherein
the power supply comprises a capacitor and a comparator;
the capacitor is electrically connected to: an input of the comparator, the rectifier associated with the first one of the taps, and, if an additional one of the taps is electrically connected to the power supply through the tap selection circuit, to the additional one of the taps;
the comparator is configured to compare a voltage across the capacitor to a reference voltage;
the controller is electrically connected to an output of the comparator; and
the status of the power supply comprises an output value of the comparator.

15. The system of claim 14, wherein the comparator has two possible output values: a first output value and a second output value, and the comparator has the first output value except when the voltage across the capacitor is greater than the reference voltage.

16. An electronic relay configured to be powered by a single current transformer (CT), the electronic relay comprising:
a power supply configured to be electrically connected to a first tap on a multi-tap secondary coil of a single current transformer (CT) such that the power supply receives electrical power from the current transformer;
a current measuring apparatus electrically connected to a current measuring node and configured to produce an indication of an amount of current flowing in the secondary coil;
a tap selection circuit comprising a plurality of switches, the tap selection circuit configured to electrically connect one or more other of the taps on the multi-tap secondary coil to the power supply; and
a controller electrically connected to the power supply and the current measuring apparatus, the controller being configured to: determine whether to change the turns ratio of the CT based on the indication the amount of current in the multi-tap secondary coil.

17. The electronic relay of claim 16, wherein each of the plurality of switches is configured to electrically connect one of the other taps to the power supply; and the tap selector further comprises a power supply tap switch configured to electrically connect the first tap to the power supply.

18. The electronic relay of claim 17, wherein the power supply tap switch comprises a normally on switch.

19. The electronic relay of claim 16, wherein the power supply is configured to remain electrically connected to the first tap during operational use of the electronic relay.

20. A system comprising:
a current transformer comprising:
a primary coil; and
a secondary coil comprising taps;
a tap selection circuit;
a current measurement apparatus configured to produce an indication of an amount of current flowing in the secondary coil;
a power supply electrically connected to a first one of the taps, the power supply configured to receive electrical power from the first one of the taps; and
a controller coupled to the power supply and the current measurement apparatus, the controller configured to receive electrical power from the power supply and to control the tap selection circuit based on the indication of an amount of current in the secondary coil; and
a shunting switch electrically connected to a particular one of the taps, the shunting switch comprising at least a first state and a second state, and wherein, in the first state, the shunt switch draws current from the particular one of the taps such that current from the particular one of the taps is not provided to the power supply.

21. The system of claim 20, wherein the current transformer has a variable turns ratio, the taps comprise at least the first tap and a last tap, the first tap is associated with a minimum turns ratio, and the last tap is associated with a maximum turns ratio; and
the shunting switch is electrically connected to the last tap such that, when the shunting switch is in the first state, the shunting switch shunts substantially all of the current from the secondary winding.

22. A controller for dynamically adjusting a turns ratio of a current transformer, the controller comprising:
an interface configured to connect the controller to a power supply, a tap selector, and a current measurement apparatus;
an electronic processing module comprising one or more electronic processors; and
an electronic storage comprising instructions that, when executed, cause the electronic processing module to:
determine a metering current based on information from the current measurement apparatus;
determine whether to change a turns ratio of the current transformer based on the metering current; and
if it is determined to change the turns ratio of the current transformer, control a state of one or more of a plurality of switches in the tap selector to select one or more of a plurality of taps on a multi-tap secondary winding of the current transformer.

23. The controller of claim 22, wherein the controller is further coupled to a circuit breaker, and the electronic storage further comprises instructions that, when executed, cause the electronic processing module to:
determine whether a trip condition exists based on the metering current; and
if a trip condition exists, activate a circuit breaker to disconnect the current transformer from a load.

* * * * *